(12) United States Patent
Domeij (10) Patent No.: US 8,829,533 B2
(45) Date of Patent: Sep. 9, 2014

(54) SILICON CARBIDE SEMICONDUCTOR DEVICE

(75) Inventor: Martin Domeij, Sollentuna (SE)

(73) Assignee: Fairchild Semiconductor Corporation, San Jose, CA (US)

( * ) Notice: Subject to any disclaimer, the term of this patent is extended or adjusted under 35 U.S.C. 154(b) by 439 days.

(21) Appl. No.: 12/450,708

(22) PCT Filed: Apr. 10, 2008

(86) PCT No.: PCT/SE2008/050408
§ 371 (c)(1),
(2), (4) Date: Oct. 8, 2009

(87) PCT Pub. No.: WO2008/127186
PCT Pub. Date: Oct. 23, 2008

(65) Prior Publication Data
US 2010/0117097 A1    May 13, 2010

(30) Foreign Application Priority Data

Apr. 11, 2007  (SE) ..................... 0700896

(51) Int. Cl.
| H01L 29/15 | (2006.01) |
| H01L 29/36 | (2006.01) |
| H01L 29/73 | (2006.01) |
| H01L 29/66 | (2006.01) |
| H01L 29/868 | (2006.01) |
| H01L 29/08 | (2006.01) |
| H01L 29/06 | (2006.01) |
| H01L 29/16 | (2006.01) |

(52) U.S. Cl.
CPC ............... *H01L 29/73* (2013.01); *H01L 29/36* (2013.01); *H01L 29/66068* (2013.01); *H01L 29/868* (2013.01); *H01L 29/0821* (2013.01); *H01L 29/1608* (2013.01); *H01L 29/0615* (2013.01)
USPC ........................................................... 257/77

(58) Field of Classification Search
USPC ............ 257/28, 77, 142, 148, 194, 221, 264, 257/269, 345, 404, 558, E21.054, E21.055, 257/216, 219
See application file for complete search history.

(56) References Cited

U.S. PATENT DOCUMENTS

| 4,945,394 A | 7/1990 | Palmour et al. |
| 5,016,075 A * | 5/1991 | Minato ........................ 257/556 |

(Continued)

FOREIGN PATENT DOCUMENTS

| EP | 0 921 574 A2 | 6/1999 |
| EP | 1 693 896 | 8/2006 |

(Continued)

OTHER PUBLICATIONS

International Search Report for PCT/SE2008/050408, mailed Aug. 12, 2008.

(Continued)

*Primary Examiner* — Yu-Hsi D Sun (57) ABSTRACT

The present invention relates to a semiconductor device (1) in silicon carbide, with a highly doped substrate region (11) and a drift region (12). The present invention specifically teaches that an additional layer (13) is positioned between the highly doped substrate region (11) and the drift region (12), the additional layer (13) thus providing a wide safe operating area at subsequently high voltages and current densities.

21 Claims, 5 Drawing Sheets a)        b)

(56) References Cited

U.S. PATENT DOCUMENTS

| | | | |
|---|---|---|---|
| 5,163,178 A * | 11/1992 | Gomi et al. | 257/558 |
| 6,525,346 B2 * | 2/2003 | Mizutani | 257/183 |
| 6,815,304 B2 | 11/2004 | Sankin et al. | |
| 6,982,440 B2 | 1/2006 | Van Zeghbroeck et al. | |
| 7,276,773 B2 * | 10/2007 | Saito et al. | 257/492 |
| 7,304,334 B2 * | 12/2007 | Agarwal et al. | 257/197 |
| 7,470,930 B2 * | 12/2008 | Okuno et al. | 257/66 |
| 2001/0045598 A1 * | 11/2001 | Korec et al. | 257/330 |
| 2002/0195626 A1 * | 12/2002 | Tran et al. | 257/285 |
| 2003/0080842 A1 | 5/2003 | Sumakeris et al. | |
| 2005/0087765 A1 * | 4/2005 | Saito et al. | 257/192 |
| 2005/0230702 A1 | 10/2005 | Kartal et al. | |
| 2006/0011924 A1 * | 1/2006 | Mazzola et al. | 257/77 |
| 2006/0022292 A1 | 2/2006 | Shenoy | |
| 2006/0261371 A1 * | 11/2006 | Kuroda et al. | 257/194 |
| 2006/0273379 A1 * | 12/2006 | Bhalla et al. | 257/330 |
| 2007/0114602 A1 * | 5/2007 | Saito et al. | 257/330 |

FOREIGN PATENT DOCUMENTS

| | | |
|---|---|---|
| FR | 2543736 A1 | 10/1984 |
| WO | WO 03/038876 A1 | 5/2003 |
| WO | WO 2007/036456 | 4/2007 |
| WO | 2008/088019 A1 | 7/2008 |

OTHER PUBLICATIONS

Office Action Response filed for Swedish Patent Application No. 0700896-4, filed on Feb. 26, 2008, 4 pages of Office Action Response and 3 pages of English Translation.

Office Action Response filed for Swedish Patent Application No. 0700896-4, filed on Sep. 3, 2009, 4 pages of Office Action Response and 3 pages of English Translation.

Office Action received for Swedish Patent Application No. 0700896-4, mailed on Oct. 26, 2007, 3 pages of Office Action and 2 pages of English Translation.

Office Action received for Swedish Patent Application No. 0700896-4, mailed on Jul. 7, 2009, 2 pages of Office Action and 2 pages of English Translation.

Danielsson, Erik, et al., "Extrinsic Base Design of SiC Bipolar Transistors", Silicon Carbide and Related Materials, Materials Science Forum, vols. 457-460, 2004, pp. 1117-1120.

Domeij, Martin, et al., "On the Destruction Limit of Si Power Diodes During Reverse Recovery With Dynamic Avalanche", IEEE Transactions on Electron Devices, vol. 50, No. 02, Feb. 2003, pp. 486-493.

Egawa, Hideharu, "Avalanche Characteristics and Failure Mechanism of High Voltage Diodes", IEEE Transactions on Electron Devices, vol. ED-13, No. 11, Nov. 1966, pp. 754-758.

Hower, Philip L., et al., "Avalanche Injection and Second Breakdown in Transistors", IEEE Transactions on Electron Devices, vol. ED-17, No. 04, Apr. 1970, pp. 320-335.

Krishnaswami, Sumi, et al., "1000-V, 30-A 4H-SiC BJTs With High Current Gain", IEEE Electron Device Letters, vol. 26, No. 03, Mar. 2005, pp. 175-177.

Lendenmann, H., et al., "Long Term Operation of 4.5kV PiN and 2.5kV JBS Diodes", Silicon Carbide and Related Materials 2000, Materials Science Forum, vols. 353-356, 2001, pp. 727-730.

Luo, Y., et al., "Demonstration of 4H-Sic Power Bipolar Junction Transistors", Electronics Letters, vol. 36, No. 17, Aug. 17, 2000, pp. 1496-1497.

Münch, W., et al., "Silicon Carbide Bipolar Transistor", Solid-State Electronics, vol. 21, Issue 2, 1978, pp. 479-480.

Nakagawa, A., et al., "600- and 1200-V Bipolar-Mode MOSFET's with High Current Capability", IEEE Electron Device Letters, vol. EDL-6, No. 07, Jul. 1985, pp. 378-380.

Ryu, Sei-Hyung, et al., "1800V, 3.8A Bipolar Junction Transistors in 4H-SiC", 58th DRC Conference Digest on Device Research Conference, 2000, pp. 133-134.

Vodakov, Yu A., et al., "Electrical properties of a p-n-n+ structure formed in silicon carbide by implantation of aluminum ion", Soviet Physics Semiconductors, vol. 21, No. 09, Sep. 1987, pp. 1017-1020.

Extended European Search Report received for European Patent Application No. 08741898.4, mailed on Mar. 26, 2012, 7 pages.

* cited by examiner

SILICON CARBIDE SEMICONDUCTOR DEVICE

This application is the U.S. national phase under 35 U.S.C. 371 of International Application No. PCT/SE2008/050408 filed 10 Apr. 2008, which claims priority to Sweden Application No. 0700896-4 filed 11 Apr. 2007, the entire contents of each of which are hereby incorporated by reference.

FIELD OF INVENTION

The present invention relates to a semiconductor device in silicon carbide, with a highly doped substrate region and a drift region.

DESCRIPTION OF BACKGROUND ART

Silicon carbide (SiC) has excellent properties for fabrication of power semiconductor devices. SiC has due to its wide bandgap nearly ten times higher critical field strength than silicon and the wide bandgap also provides the possibility for devices that can operate at high temperatures. The thermal conductivity of SiC is also 2-3 times higher than for Si and this improved heat transport means that SiC devices can operate at higher power densities without being overheated.

Power switching transistors and diodes are used in a wide variety of power electronic systems such as power supplies, motor drives, welding, electric vehicles, trains and transmission and distribution of electric power on the grid It is important to reduce power losses in power transistors and diodes as much as possible, since the power losses are wasted energy and because they limit the minimum size of the power electronic system. Today, power transistors in silicon (Si) such as MOSFETs and Insulated Gate Bipolar Transistors (IGBTs) are dominant in power electronics. The minimum power losses of these Si devices are, however, limited by the thick lowly doped drift region that is necessary to ensure high voltage blocking capability. The thick drift region adds to the on-state resistance of the devices thus increasing the power losses during conduction and in bipolar Si devices there is a significant stored charge that causes slower switching and increased switching power losses. The fundamental material properties of Si are a barrier to substantial reductions of the power losses, that become more and more limiting for the continuous downscaling of power electronic systems. Another more promising way to reduce the power losses is to develop power devices in a new material with wider bandgap.

Silicon carbide (SiC) is the most mature of the wide bandgap semiconductors. High-quality wafers in SiC are available, and thermal $SiO_2$ can be grown to fabricate SiC MOSFET transistors and high-quality surface passivation. SiC has about ten times higher critical field strength than Si and this means that the drift layer can be made much thinner and with a higher doping concentration. SiC devices have therefore a much lower on-state resistance than Si devices which means lower conduction power losses, and SiC devices have less stored charge which means reduced switching power losses compared to Si bipolar devices like IGBTs.

SiC pn diodes have the disadvantage that a forward voltage of close to 3 V has to be applied to give forward conduction and this means relatively high conduction power losses for pn diodes with moderate breakdown voltages. SiC pn diodes are therefore competitive mainly in applications where breakdown voltages exceeding about 2 kV are required.

SiC bipolar junction transistors (BJTs), on the other hand, are attractive also for lower breakdown voltages because the base-emitter voltage and the base-collector voltage nearly cancel each other, and due to this junction cancellation, the forward voltage and the conduction power losses can become very low. Since the voltage blocking enabling drift region (the collector) of SiC BJTs is much thinner than for a Si bipolar device, there is also much less stored charge and the switching is faster resulting in lower switching power losses.

Bipolar junction transistors (BJTs) are well known and they are used in high frequency and in power electronics applications. BJTs have two pn junctions in close proximity to each other. A region called the collector has a junction to a region called the base and the base has a junction to a region called the emitter. The collector and emitter regions have dopings of the same type, either n-type or p-type. The base region has a doping of the opposite type as the collector and emitter. The most commonly used bipolar transistor, referred to as npn bipolar junction transistor, has emitter and collector regions with n-type doping and a base region with p-type doping.

The emitter, base and collector have separate metal contacts that can be biased with respect to each other. If the base-emitter voltage is less than the built-in potential of the base-emitter junction, then the BJT is in its off-state. In the off-state, the BJT can block a high positive voltage applied between the collector and the emitter. The blocking capability is limited by avalanche breakdown of the base-collector junction if the base is designed with a doping dose high enough to avoid punch-through at voltages below the avalanche breakdown voltage. The avalanche breakdown voltage is limited by the doping and thickness of the collector region which constitutes the drift region in the BJT.

If the base-emitter voltage is about equal to, or larger than, the built-in potential of the base-emitter junction then the BJT is in its on-state. In the on-state, electrons are injected from the emitter to the base and, provided that the base is thin enough and the carrier lifetime is sufficiently high, most electrons diffuse through the base without recombining and reach the collector, thus causing a collector current. The emitter is doped with a higher concentration of n-type dopants than the concentration of p-type dopants in the base, in order to achieve high emitter injection efficiency, which means that the current at the base-emitter junction is dominated by electrons.

The collector current $I_C$ in the BJT, in the on-state, consists mainly of electrons that are injected from the emitter and diffuse through the base. $I_C$ is therefore controlled by the base current $I_B$ and $I_C$ is equal to the current gain $\beta$ times $I_B$. A high current gain is desired for a power BJT to be able to keep the BJT in its on-state with as low base current as possible, to simplify the drive circuit requirements.

Figure 1:
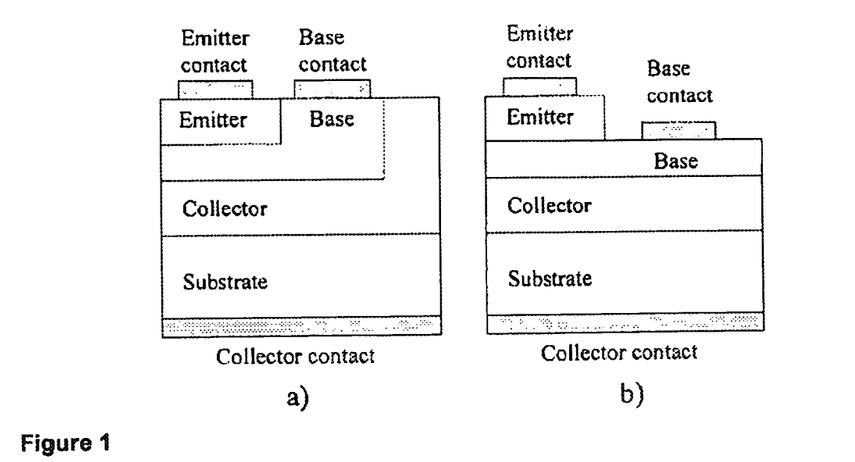
FIG. 1 shows schematically a cross-section of vertical power bipolar junction transistors according to prior art; a) showing laterally confined emitter and base regions, and b) showing a vertical emitter structure with etched terminations of base-emitter and base-collector junctions.

Power switching BJTs have typically a vertical topology as shown schematically in FIG. 1. The n-type doped drift region (often referred to as collector), which has a doping and thickness chosen to achieve the desired breakdown voltage, is placed on top of a substrate which has a high n-type doping to minimize the series resistance and to simplify fabrication of the collector ohmic contact.

A base layer with p-type doping is located on top of the collector and an n-doped emitter region on top of the base region. The base and collector regions can be laterally confined after fabrication by local diffusion or ion implantation (see FIG. 1a), or the base and emitter regions can be placed vertically on top of the collector region with junction termination by local etching of the semiconductor (see FIG. 1b).

SiC bipolar junction transistors (BJTs) are well known. See for example:

Münch et al., "Silicon Carbide Bipolar Transistor", Solid-State Electronics, Vol. 21, pp. 479-480, (1978)

Luo et al., "Demonstration of 4H-SiC Power Bipolar Junction Transistors", Electronic Letters, Vol. 36, No. 17, (2000)

Ryu et al., "1800 V, 3.8 A bipolar junction transistors in 4H-SiC", Proceedings of the 58$^{th}$ Device Research Conference (DRC), p. 133, (2000)

The vertical BJT structure shown in FIG. 1b is most commonly used for SiC BJTs since diffusion of dopants cannot be used, and ion implantation has been found to create current gain degrading defects if it is performed in the active region of the bipolar junction transistor.

One crucial aspect in fabrication of SiC BJTs is the need to form a highly doped p-type region locally under the base contact. The highly doped p-type region can be formed in two ways:

1) By ion implantation of p-type dopants as described in U.S. Pat. No. 4,945,394. Ion implantation of p-type dopants, such as aluminum is well known for forming p-doped regions in SiC pn diodes, see for example: Vodakov et al., "Electrical properties of p-n-n$^+$ structure formed in silicon carbide by implantation of aluminum ions", Soviet Physics—Semiconductors, Vol 21, No. 9, p. 1017, (1987)

2) By epitaxial regrowth of a highly doped p-type region and subsequent etching as described in U.S. Pat. Nos. 6,815,304 and 6,982,440 and in Danielsson et al., "Extrinsic base design of SiC bipolar transistors", Materials Science Forum, Vols. 457-460, p. 1117, (2004)

SiC BJTs have been experimentally shown to have very low on-state voltages and therefore conduction power loss that are significantly lower than Si IGBTs and Si MOSFETs for a transistor with a breakdown voltage of 1000 V [Krishnaswami et al., "1000-V 30-A 4H-SiC BJTs with high current gain", IEEE Electron Device Letters, Vol. 26, No. 3, p. 175, (2005)]. SiC BJTs have also been shown to have a forward voltage with a positive temperature coefficient and a current gain with a negative temperature coefficient. Both temperature dependencies are important to facilitate a safe parallel connection of SiC BJTs and thereby successful application in power modules that consist of several transistor chips connected in parallel.

For successful application of power switching SiC BJTs, a relatively high current gain exceeding 50 is probably required, and a wide safe operating area must be proved.

SiC pn diodes are known, and high voltage blocking capability has been shown experimentally [Lendenmann et al., "Long term operation of 4.5 kV PIN and 2.5 kV JBS diodes", Materials Science Forum, Vols. 353-356, p. 727, (2001)]. SiC pn diodes have a lowly n-doped region called drift layer on top of the n-doped substrate. The drift layer is designed with sufficiently low doping and sufficient thickness to obtain a high breakdown voltage.

Figure 2:
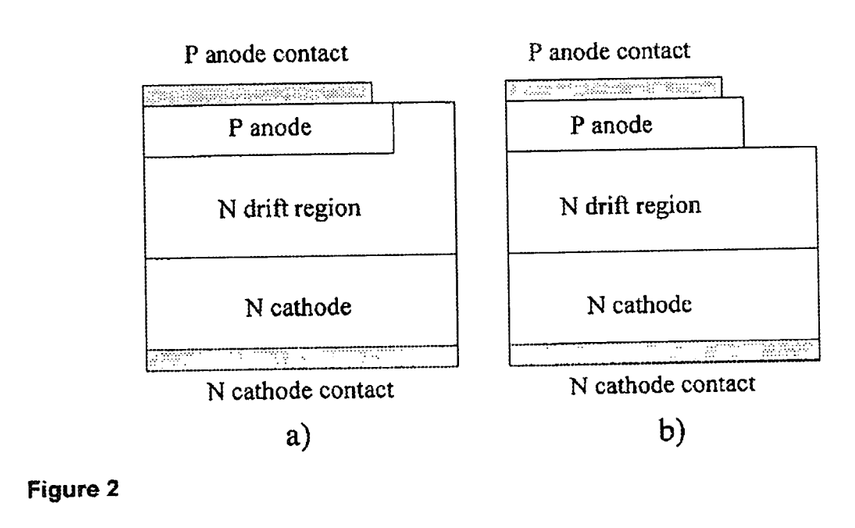
FIG. 2 shows schematically a cross-section of vertical pn diodes according to prior art; a) showing a laterally confined p-anode region, and b) showing a vertical p-anode structure with etched terminations of the pn junction.

A p doped region can either be placed on top of the drift layer or be laterally confined after fabrication by local diffusion or ion implantation. Both types of SiC pn diodes are shown in FIG. 2. Metal is deposited, patterned and etched to form an anode contact to the p-type region and a cathode contact to the n-doped substrate.

Both for the SiC BJT and for the SiC pn diode a wide safe operating area is required. In the following sections, it is described how the present invention provides a wider safe operating area for SiC semiconductor devices. The above described SiC BJTs and SiC pn diodes are two preferred embodiments of the invention, in which the benefits of the invention are substantial.

The so-called buffer layers according to prior art has traditionally been used to prevent the electric field from reaching the p layer in a so-called punch-through IGBT and at the same time reduce the injection of holes from the p layer [Nakagawa et. al., 600- and 1200-V Bipolar-Mode MOSFET's with High Current Capability", IEEE Electron Device Letters, Vol. EDI-6, No. 7, p. 378, (1985)].

Figure 3:
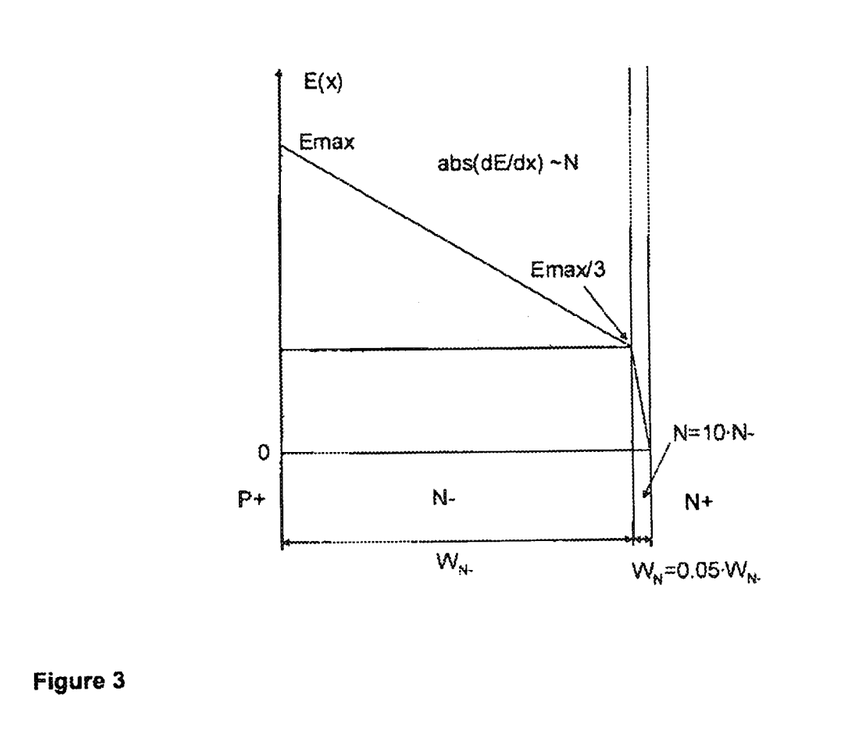
FIG. 3 is a graph showing design of a traditional buffer layer according to prior art.

A silicon carbide diode can have a traditional buffer layer with a doping concentration in the range of one to two orders of magnitude higher than the doping concentration of the drift region. We assume the lowest buffer layer doping, i.e. ten times higher than the doping of the drift region. If the diode is made with a conventional punch-through design that minimizes its unipolar series resistance, then the electric field distribution at the limit of avalanche breakdown will look as shown in FIG. 3. The electric field at the right border of the drift region is now ⅓ of the maximum electric field Emax which is reached at the pn junction. The buffer layer has ten times higher doping concentration than the drift region and the ten times higher space charge concentration causes the gradient of the electric field to increase by a factor of ten compared to the drift region. The buffer layer in the silicon carbide diode is designed to reduce the electric field to zero before it reaches the highly doped n$^+$ substrate and FIG. 3 shows that the buffer layer thickness ($W_n$) only has to exceed 5% of the thickness of the drift region ($W_{n-}$) to reduce the electric field to zero before it reaches the highly doped n$^+$ substrate. If the doping concentration of the buffer layer (N) is higher than the doping concentration of the drift region (N−) by more than one order of magnitude (as is typical) then the buffer layer can be made even thinner without a high electric field reaching the n$^+$ substrate.

Publication EP 1693896 A1 shows another use of buffer layers, which is to prevent free carriers in a silicon carbide device from reaching and recombining in the heavily doped substrate where they can cause formation of stacking faults and a thereby associated device degradation. This type of buffer layer can be made thicker than conventional buffer layers. In order to work efficiently, the doping concentration in the buffer layer must then, however, be considerably higher than the doping concentration of conventional buffer layers.

SUMMARY OF THE PRESENT INVENTION

Technical Problems

It is known that the safe operating area of bipolar junction transistors in Si is limited by second breakdown [Hower et al., "Avalanche injection and second breakdown in transistors", IEEE Transactions on Electron Devices, Vol. ED-17, No. 4, p. 320, (1970)], and that this effect is caused by the space effects that are induced by high current densities in combination with high voltages. The limits of second breakdown are important for BJTs during turn-off to high voltages and during short-circuit conditions.

It is further known that the safe operating area of pn diodes in Si during fast turn-off to high voltages is limited by dynamic avalanche [M. Domeij et al., "On the destruction limit of Si power diodes during reverse recovery with dynamic avalanche", IEEE Transactions on Electron Devices, Vol. 50, No. 2, p. 486, (2003)], and that a similar type of space charge effects limit the safe operating of Si pn diodes and in the Si BJTs. The space charge effects can, in a condensed manner, be described as follows:

At high electric fields, the drift velocities of electrons and holes are limited to the carrier saturation velocity, and at high current densities, the carrier concentrations therefore increase and their concentrations depend on the local current densities. In a high voltage device at high current densities, the free carrier concentrations can exceed the doping concentration in the lowly doped drift layer and the space charge of the free carriers will then influence the local electric field significantly. At some critical combination of applied voltage and current density, the current controlled space charge will induce a negative differential resistance for the device, and this negative differential resistance leads to the formation of high current density filaments, which in most cases cause local overheating and destruction of the device. The occurrence of the negative differential resistance is associated with the appearance of impact ionization leading to the injection of free carriers into the drift region from both sides.

In a pn diode this negative differential resistance can occur either as the diode is driven deep into avalanche breakdown [Egawa, "Avalanche characteristics and failure mechanism of high voltage diodes", IEEE Transactions on Electron Devices, Vol ED-13, No. 11, p. 754, (1966)] or as an effect of dynamic avalanche that occurs during fast turn-off of the diode to a high voltage [Domeij above]. The negative differential resistance is in both cases caused by the appearance of impact ionization at both sides of the drift region.

In a BJT, the negative differential resistance can occur during avalanche breakdown or as a result of dynamic avalanche during turn-off or during short-circuit conditions. One important difference between the pn diode and the BJT is that higher current densities can appear locally in the BJT during turn-off and lead to dynamic avalanche at lower total device currents than for the diode which has a more homogeneous current distribution.

Due to the inhomogenous current distribution, the present invention is of particular interest for the SiC BJT.

It is a problem to improve the safe operating area of SiC semiconductor devices.

It is a problem to suppress the occurrence of a negative differential resistance and thus push the onset of negative resistance to higher current densities, thereby widening the safe operating area.

It is also a problem to modify the electric field distribution in the border region between the drift region and the n-doped substrate in order to achieve the desired suppression of the occurrence of a negative differential resistance and the pushing of the onset of negative resistance to higher current densities.

Solution

With the purpose of solving the above mentioned technical problems the present invention teaches that the safe operating area of SiC semiconductor devices is improved by the use of an n-doped additional layer, with optimized doping and thickness, between the n-doped substrate and the n-doped drift region, i.e. the region which has a doping and thickness designed for ensuring sufficient voltage blocking capability. The present invention extends the prior art of so-called buffer layers, which has traditionally been used to prevent the electric field from reaching the p layer in a so-called punch-through IGBT and at the same time reduce the injection of holes from the p layer. An extension of this traditional buffer layer can be used in a silicon carbide diode to prevent a high electric field from reaching the heavily doped n⁺ substrate which can be of lower material quality than the drift region which has been grown epitaxially.

The additional layer of the present invention differs from the traditional buffer layer not only in the purpose and technical effect of the extra layer but also in physical design by being substantially thicker than the traditional buffer layer, where the thickness of a traditional buffer layer only has to exceed 5% of the thickness of the drift region as shown in relation to FIG. 3 in the previous description of prior art, and where the traditional buffer layer can be even thinner if a higher doping concentration is used.

Publication EP 1693896 A1, as described in prior art, teaches a use of buffer layers that can be made thicker than conventional buffer layers, but then also with a doping concentration in the buffer layer that is considerably higher than the doping concentration of conventional buffer layers and most certainly higher than the doping concentration of the additional layer according to the present invention.

In BJTs and pn diodes the critical location, inside the device, that determines the onset of the negative resistance is the border between the drift region and the n-doped substrate. The present invention teaches that the electric field distribution in the border region between the drift region and the n-doped substrate is modified by the introduction of an additional n-doped layer between the drift layer and the n-doped substrate. The doping and the thickness of the additional layer are optimized to suppress the occurrence of a negative differential resistance and thus push the onset of negative resistance to higher current densities, thereby widening the safe operating area.

Buffer layers between the drift layer and the n-doped substrate are known and can be used for improving the material quality of the epitaxially grown drift layers. These known buffer layers have, however, much smaller thickness and clearly higher doping concentrations than the additional layer according to the present invention.

The additional layer of the present invention has a thickness that exceeds at least 10% the thickness of the drift region and a doping concentration below $1 \cdot 10^{17}$ cm$^{-3}$. It is thus clear that the thickness ($W_n$) of the traditional buffer layer is smaller than the width of an additional layer according to the present innovation.

The desired effects of the present invention can also be obtained using different types of additional layers. Such layers can consist of several thinner layers with different doping concentrations or a graded doping profile in the additional layer.

Advantages

The advantages of a semiconductor device according to the present invention are a wider safe operating area under the following conditions: reverse recovery to high voltages with high dI/dt for SiC pn diodes, avalanche breakdown with high currents for SiC pn diodes and BJTs, Inductive load switching to high voltages for SiC BJTs, and short-circuit operation (turn-on to a high collector current with a high collector-emitter voltage and very small series resistance) for SiC BJTs.

BRIEF DESCRIPTION OF THE DRAWINGS

A method, a system, various computer program products and a single computing unit according to the present invention will now be described in detail with reference to the accompanying drawings, in which.

DESCRIPTION OF EMBODIMENTS AS PRESENTLY PREFERRED

The present invention will now be described with reference to FIG. 4, where a silicon carbide bipolar junction transistor for power electronics applications, is described as an exemplifying embodiment of the invention.

Figure 4:
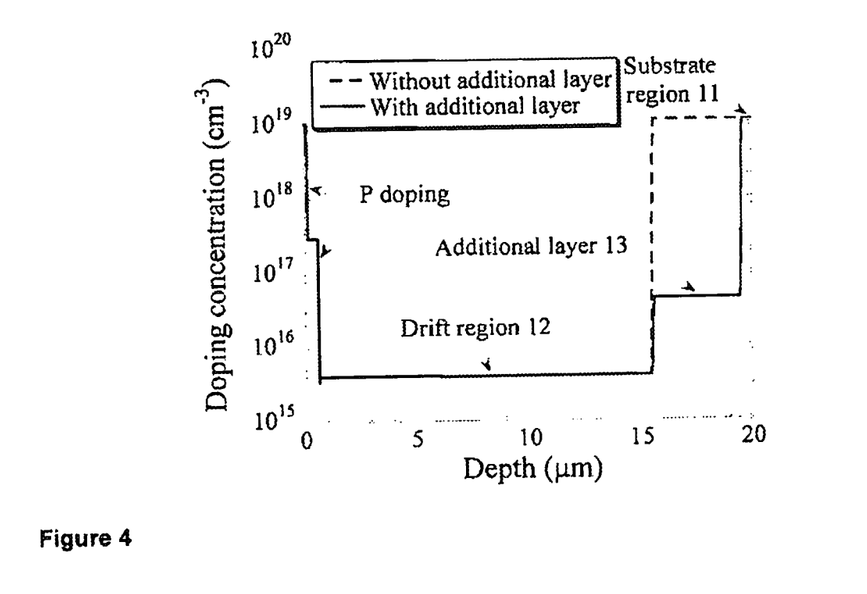
FIG. 4 is a schematic and simplified cross-section of the doping in the simulated vertical pn diode with an additional layer according to the present invention.

FIG. 4 shows schematically a semiconductor device 1 in silicon carbide, with a highly doped substrate region 11 and a drift region 12.

An additional layer 13 is positioned between the highly doped substrate region 11 and the drift region 12, the additional layer 13 providing a wider safe operating area at high voltages with subsequently high current densities.

The additional layer 13 has the same type of doping as the substrate region 11 and the drift region 12, and the doping concentration in the additional layer 13 is higher than the doping concentration in the drift region 12 and lower than the doping concentration in the substrate region 11.

The presentment invention teaches that doping concentration of the additional layer 13 can be smaller than $1 \cdot 10^{17}$ cm$^{-3}$ and that the additional layer 13 can have a thickness of at least 10% of the thickness of the drift region 12.

The additional layer can be doped in different ways, FIG. 4 showing a constant doping concentration in the additional layer 13. It is also possible to have a non-constant doping concentration in the additional layer.

Figure 5A:
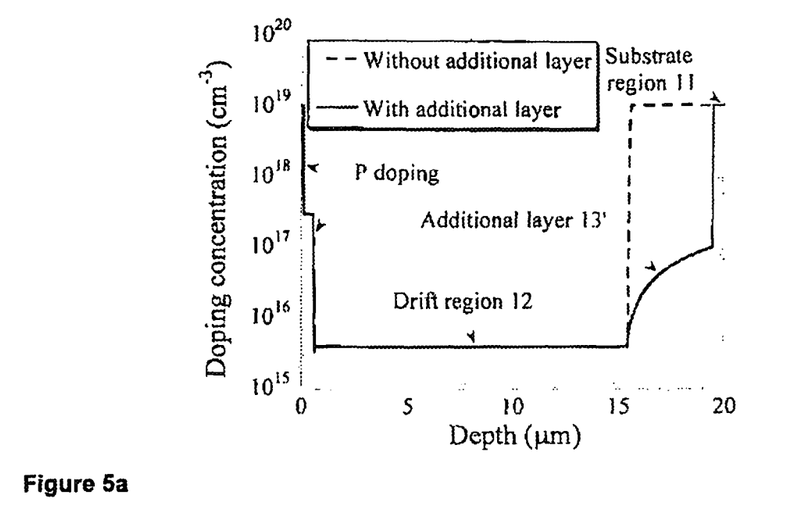
FIG. 5 is a schematic and simplified cross-section of the doping in the vertical pn diode with different types of additional layers according to the present invention.

FIG. 5a shows an embodiment where the non-constant doping concentration of the additional layer 13' has a gradient with higher concentration on the border to the substrate region 11 than on the border to the drift region 12.

Figure 5B:
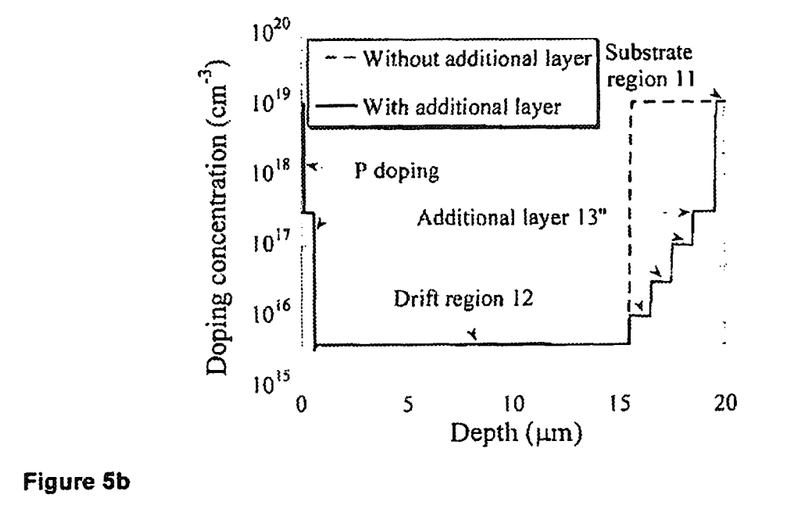

FIG. 5b shows an embodiment where the additional layer 13" consist of several internal layers, each internal layer being thinner than 10% of the width of the drift region 12. The internal layers closer to the substrate region 11 have a higher doping concentrations than the internal layers closer to the drift region 12.

The embodiment illustrated in FIG. 4 shows a SiC pn diode designed for about 1200 V. The p anode contact is to the left (at depth=0) and the n cathode contact to the right (at depth=20 μm). A diode with an additional layer is shown with a solid line and a diode without an additional layer is shown with a dashed line.

The drift layer (12) has a n-type doping with a doping concentration of $4 \cdot 10^{15}$ cm$^{-3}$ and a thickness of 15 μm.

Highly doped p and n regions are present on both sides as shown in the FIG. 3. The structure to be analyzed is a one-dimensional pn diode and this pn diode constitutes also the base-collector junction of a SiC BJT. In the following, device simulation results will be presented to illustrate the efficiency of the additional layer (13) for suppressing the occurrence of a negative differential resistance. The device simulation solves locally Poisson's equation and the continuity equations for electrons and holes including impact ionization.

The pn diode is an adequate model for simulating also the safe operating area (SOA) limit of a bipolar transistor qualitatively since the space charge effects that limit the SOA in BJTs and pn diodes are similar. Some quantitative difference can, however, be expected because the current distribution in a BJT is more inhomogeneous than in a pn diode and therefore higher current densities are likely to occur in BJTs than in pn diodes, thus making the BJT more sensitive to the appearance of negative differential resistance and destruction.

Figure 6:
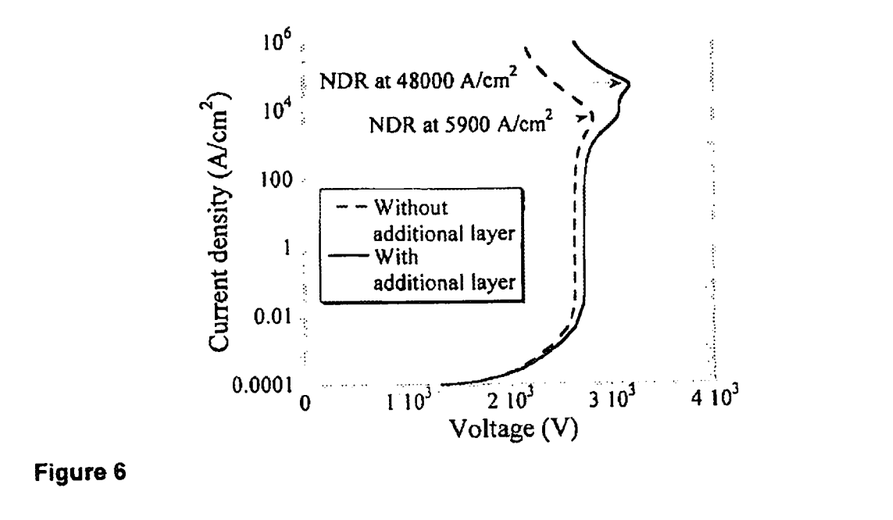
FIG. 6 is a graph with a simulated current density vs. voltage applied between the n cathode contact and the p anode contact, where a diode with an additional layer is shown with a solid line and a diode without an additional layer is shown with a dashed line.

FIG. 3 shows the doping profiles with and without the additional layer (13). The doping concentration in the additional layer is carefully chosen to compensate for the charge of free carriers at high current densities and thereby suppress the appearance of a high electric field and impact ionization at the border of the substrate. FIG. 6 shows the simulated current density vs. voltage applied positive from the n-doped side of the diode with reference to the p-doped side of the pn diode, i.e. the pn diode is reverse biased. Avalanche breakdown starts between 2600 V and 2800 V for both diodes and the current increases by orders of magnitude with very small further increases of the voltage, as is typical for avalanche breakdown with moderate current densities. In the range of hundreds of A/cm$^2$, the voltage increases as the carrier saturation velocity causes increasing free carrier concentrations with a space charge that affects the electric field distribution. At 5900 A/cm$^2$, the onset of a negative differential resistance occurs for the pn diode without the additional layer.

Figure 7:
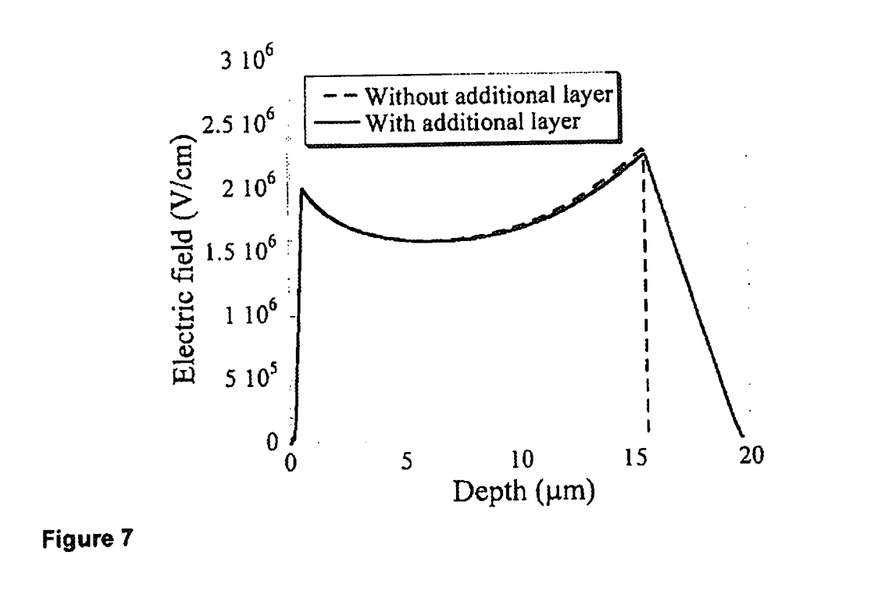
FIG. 7 is a graph with a simulated electric field distribution in cross-section of the pn diodes at a current density of 20 000 A/cm$^2$ (see FIG. 6) vs. voltage applied between the n cathode contact and the p anode contact, where a diode with an additional layer is shown in solid line and diode without an additional layer is shown in dashed line.

The negative differential resistance appears simultaneously with the onset of impact ionization at the border between the drift layer and the substrate layer leading to a hammock-shaped electric field distribution as shown in FIG. 7, which shows the electric field distributions at a simulated current density of 20 000 A/cm$^2$ (from FIG. 6). Experimental experience and stability considerations indicate that this negative resistance causes device destruction and represents the boundary of the safe operating area. This conclusion is also supported by [Egawa, "Avalanche characteristics and failure mechanism of high voltage diodes", IEEE Transactions on Electron Devices, Vol ED-13, No. 11, p. 754, (1966) and Hower et al., "Avalanche injection and second breakdown in transistors", IEEE Transactions on Electron Devices, Vol. ED-17, No. 4, p. 320, (1970)].

The doping concentration in the additional layer is carefully controlled to create a positive charge that compensates for the negative charge of free electrons at high current densities. FIG. 7 illustrates that even with impact ionization occurring, now at the border between the drift region and the additional layer, the electric field decays slowly in the additional layer thus increasing the voltage (which is the integral of the electric field) with increasing current density and thereby suppressing the occurrence of a negative differential resistance.

As a result of the additional layer, the negative differential resistance occurs instead at 48 000 A/cm$^2$, i.e. at eight times higher current density than without the additional layer. This eightfold improvement represents no fundamental limit for the improvement of the safe operating area that is possible when using an additional layer. Thicker additional layers will increase the critical current density even more. The additional layer can be designed according to the device requirements. The penalty that is paid for the additional layer is a limited extra cost for a little bit longer epitaxial growth time, and a small increase of the on-state resistance. This increase is, however, modest since the additional layers are doped significantly higher than the drift layer and suitable additional layers are also substantially thinner than the drift region.

The simulation results show that the critical current density for the onset of negative resistance increases significantly by application of the present invention. The invention becomes more important for devices with higher breakdown voltage, because lower doping concentrations in the drift region lead to space charge effects and negative differential resistances at lower current densities.

It should be pointed out that the presented simulation shows the stability of a pn diode in avalanche breakdown at high current densities. Similar distributions of the electric field in the border region between the drift region and the n-doped substrate appear, however, also in BJTs and pn diodes well below the breakdown voltage also during fast turn-off to high voltages and for the BJT also during short-circuit conditions. The analysis of these phenomena by device simulations is more complex but the same principles apply to the increase of the critical current density, and the associated improvement of the safe operating area, using the additional layer of the present invention.

Figure 8:
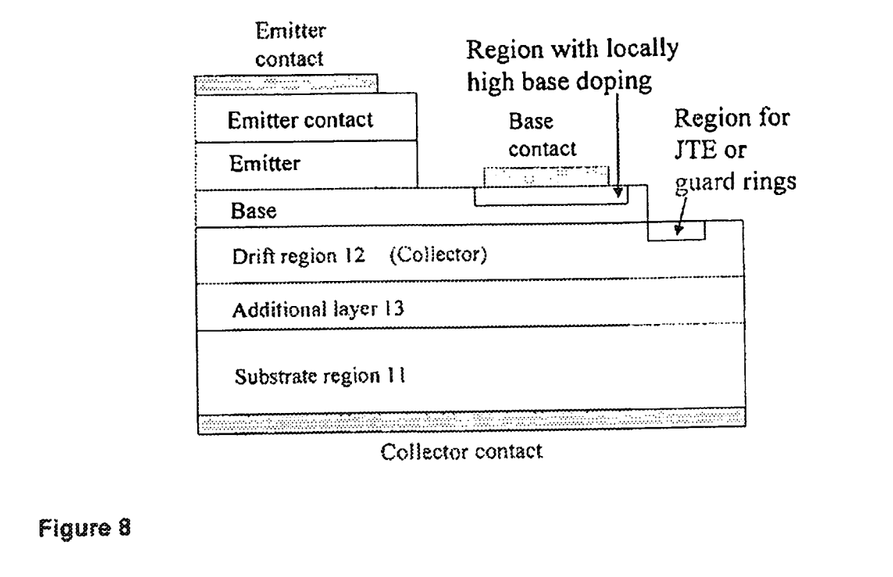
FIG. 8 is a schematic cross-section of a proposed inventive SiC BJT.

FIG. 8 shows a cross-section of one cell of the active region of the NPN SiC BJT of the preferred embodiment of the present invention. Six layers with different doping concentrations are present in the BJT of the present invention as shown in Table 1.

TABLE 1

The layers of the SiC BJT of the present invention

| Region | Doping type | Doping concentration | Thickness |
|---|---|---|---|
| Emitter contact | N | $N_C$ (very high) | $W_C$ |
| Emitter | N | $N_E$ (high) | $W_E$ |
| Base | P | $N_B$ (medium) | $W_B$ |
| Drift (collector) | N | $N_C$ (low) | $W_C$ |
| Additional layer | N | $N_B$ (medium) | $W_B$ |
| Substrate | N | $N_S$ (high) | $W_S$ |

The layers are designed with thicknesses and doping concentrations that are determined by the following requirements:

A high current gain is important to control the BJT with a small base current. The current gain is enhanced by using a narrow base (a small $W_B$) to reduce the base recombination. It is also important that the emitter doping ($N_E$) is significantly higher than the base doping ($N_B$) to improve the emitter efficiency and the current gain. In addition, a high material quality with a high carrier lifetime τ in the base layer is important to reduce the recombination in the base and a low surface recombination velocity S at the side-wall of the base-emitter junction. A low surface recombination is obtained using a high quality passivation of the etched surface that terminates the base-emitter junction. This passivation can consist of silicon dioxide or other insulator materials that can be fabricated with low defect concentrations at the surface.

Designing the SiC BJT for high voltage blocking imposes a requirement of a maximum allowed collector doping $N_C$ and a minimum required width of the collector region $W_C$.

In addition, the maximum blocking voltage also imposes a requirement of a minimum doping concentration $N_B$ in the base and a minimum thickness of the base region $W_B$ to avoid punch-through of the electric field from collector to emitter. The minimum required value of $W_B$ is calculated for a given $N_B$ by determining the sum of the expansions of the depletion regions of the base-collector and base-emitter junctions into the base at the maximum blocking voltage.

The emitter doping $N_E$ is chosen in the range of $1 \cdot 10^{19}$ cm$^{-3}$ and the emitter thickness $W_E$ is about 1 μm to obtain an optimum emitter injection efficiency.

A thin emitter contact region with very high doping concentration $N_{EC} > 2 \cdot 10^{19}$ cm$^{-3}$ is used on top of the emitter layer to improve the ohmic contact to the emitter.

The additional layer, the drift region (also referred to as collector), the base region, the emitter region and the emitter contact region are fabricated by epitaxial growth, preferably in one continuous epitaxial growth run to minimize the creation of defects during growth.

After epitaxial growth, local etching of SiC is performed using a mask of deposited silicon dioxide. Two photolithographic steps are used before SiC etching to define the base-emitter junctions and the base-collector junctions, respectively. Inductively Coupled Plasma (ICP) etching of SiC is performed using deposited and patterned silicon dioxide as mask for etching.

Ion implantation of aluminum is preferably used for creating a highly doped region where the base contact will be fabricated. Deposited oxide can be used as mask for the ion implantation after a photolithographic step.

Ion implantation of p-type dopants for fabricating a contact to p-type SiC BJTs is described in U.S. Pat. No. 4,945,394. Ion implantation of p-type dopants, such as aluminum is well known for forming heavily p-doped regions in pn diodes, see for example: Vodakov et al., "Electrical properties of p-n-n$^+$ structure formed in silicon carbide by implantation of aluminum ions", Soviet Physics—Semiconductors, Vol 21, No. 9, p. 1017, (1987)

One alternative to the ion implantation step above is to use epitaxial regrowth of a highly doped p region followed by local etching as described in U.S. Pat. Nos. 6,815,304 and 6,982,440 and in Danielsson et al., "Extrinsic base design of SiC bipolar transistors", Materials Science Forum, Vols. 457-460, p. 1117, (2004).

A second step of ion implantation of aluminum is used with an energy above 100 keV and with a dose on the order of $1 \cdot 10^{13}$ cm$^{-2}$ to create a junction termination extension (JTE) to achieve sufficiently high blocking voltage capability of the base-collector junction. The JTE region is located outside the etched termination of the base-collector junction, and it is defined by a photolithographic step using photoresist as implantation mask.

High temperature annealing is performed at temperatures between 1500 and 1800° C. in an epitaxy reactor or using flash-lamp annealing.

Thermal oxidation of silicon carbide is performed to passivate the surfaces in the device and to create an isolation oxide.

Contact windows are defined using photolithographic steps, using different masks for the emitter and base contacts. Metal is deposited, by sputtering or evaporation, and patterned using lift-off of the photoresist to form metal contacts to the emitter and base regions and metal is also deposited on the backside of the wafer to form the collector contact. Separate metals are used for the n-type and p-type doped regions. Nickel is preferred for n-type and an alloy of Nickel, Titanium and Aluminum is suitable for the p-type contact.

A thick silicon dioxide isolation layer is deposited using Plasma Enhanced Chemical Vapour Deposition (PECVD). Via holes are defined by a photolithographic step and etched in the silicon dioxide using oxide dry etching. Metal, preferably aluminium or gold is deposited to fill the via holes. Finally, a last photolithographic step defines the metal pads that cover the device active region and serve as contact areas for wire bonding. Wet or dry etching of metal is used to define the metal pads for the base and emitter regions.

A backside metallization, that is suitable for soldering, is deposited and the BJT chips are cut out and prepared for soldering and wire bonding in a discrete package or in a power module.

It will be understood that the invention is not restricted to the aforedescribed and illustrated exemplifying embodiments thereof and that modifications can be made within the scope of the inventive concept as illustrated in the accompanying Claims.

The invention claimed is:

1. A semiconductor device in silicon carbide comprising:
   a drift region;
   a substrate region; and
   an additional layer, disposed between the drift region and the substrate region, having the same type of doping as said substrate region and said drift region, the additional layer having a doping concentration higher than the doping concentration in the drift region and lower than a doping concentration in the substrate region, the additional layer having a thickness at least 10% of a thickness of the drift region and being thinner than the thickness of the drift region, the drift region having a top surface, the drift region having a substantially uniform doping concentration along a vertical direction substantially orthogonal to the top surface of the drift region.

2. The semiconductor device according to claim 1, wherein said additional layer has a non-constant doping concentration.

3. The semiconductor device according to claim 2, wherein the non-constant doping concentration of the additional layer has a gradient with a higher doping concentration on a border with the substrate region than a doping concentration on a border with the drift region.

4. The semiconductor device according to claim 2, wherein the additional layer includes a plurality of internal layers, each internal layer from the plurality of internal layers is thinner than 10% of a width of the drift region, an internal layer from the plurality of internal layers closer to the substrate region has a higher doping concentration than an internal layer from the plurality of internal layers closer to the drift region.

5. The semiconductor device according to claim 1, wherein the doping concentration of the additional layer is selected to create a positive charge that compensates for a negative charge of free electrons at high current densities.

6. The semiconductor device according to claim 1, wherein the drift region, the substrate region, and the additional layer collectively define at least a portion of a pn diode.

7. The semiconductor device according to claim 1, wherein the drift region is an n-doped region of a pn diode.

8. The semiconductor device according to claim 1, wherein the drift region, the substrate region, and the additional layer collectively define at least a portion of a bipolar junction transistor (BJT).

9. The semiconductor device according to claim 1, wherein the drift region is a collector of a BJT.

10. The semiconductor device according to claim 1, further comprising:
    an emitter contact coupled to an emitter region;
    a base contact coupled to a base region disposed between the emitter region and the drift region; and
    a collector contact coupled to the substrate region.

11. The semiconductor device according to claim 1, wherein the doping concentration of the additional layer is smaller than $1\times10^{17}$ cm$^{-3}$.

12. The semiconductor device according to claim 1, wherein the additional layer has a doping concentration greater than or equal to 10 times a doping concentration of the drift region.

13. A bipolar junction transistor (BJT) in silicon carbide, comprising:
    an emitter contact;
    a base contact;
    a doped substrate;
    a collector region; and
    an additional layer disposed between the doped substrate and the collector region, the additional layer having the same type of doping as the doped substrate and the collector region, the additional layer having a doping concentration higher than a doping concentration in the collector region and lower than a doping concentration in the doped substrate, the additional layer having a thickness of at least 10% of a thickness of the collector region and being thinner than the thickness of the collector region.

14. The BJT of claim 13, wherein the doped substrate, the additional layer and the collector region have an n-type doping.

15. The BJT of claim 13, wherein the emitter contact is separate from the base contact.

16. The BJT of claim 13, wherein the BJT has a vertical topology, the emitter contact is coupled to an emitter region, the base contact is coupled to a base region disposed between the collector region and the emitter region,
    the BJT further comprising:
    a collector contact coupled to the doped substrate.

17. A method of manufacturing a semiconductor device in silicon carbide, comprising:
    forming a drift region on a doped substrate, the drift region having a top surface, the drift region having a substantially uniform doping concentration along a vertical direction substantially orthogonal to the top surface of the doped substrate; and
    forming an additional layer between the doped substrate and the drift region, the additional layer having the same type of doping as the doped substrate and the drift region, a doping concentration in the additional layer being higher than the doping concentration in the drift region and lower than a doping concentration in the doped substrate, the additional layer having a thickness of at least 10% of a thickness of the drift region and being thinner than the thickness of the drift region.

18. The method of claim 17, wherein the forming of the drift region includes epitaxial growth, and the forming of the additional layer includes epitaxial growth.

19. The method of claim 17, wherein the semiconductor device is a bipolar junction transistor.

20. The method of claim 17, wherein the semiconductor device is a pn diode.

21. The method of claim 17, further comprising:
    forming an emitter contact on an emitter region;
    forming a base contact on a base region disposed between the emitter region and the drift region; and
    forming a collector contact on the doped substrate.

* * * * *